(12) United States Patent
Grise et al.

(10) Patent No.: US 7,793,176 B2
(45) Date of Patent: Sep. 7, 2010

(54) METHOD OF INCREASING PATH COVERAGE IN TRANSITION TEST GENERATION

(75) Inventors: Gary D. Grise, Colchester, VT (US); David J. Hathaway, Underhill, VT (US); Vikram Iyengar, S. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 11/696,981

(22) Filed: Apr. 5, 2007

(65) Prior Publication Data

US 2008/0250279 A1   Oct. 9, 2008

(51) Int. Cl.
 *G01R 31/28* (2006.01)
(52) U.S. Cl. .................................. 714/724; 714/726
(58) Field of Classification Search ............. 714/724, 714/726, 738, 733, 734, 30, 798, 799, 815, 714/700, 707, 48
See application file for complete search history.

(56) References Cited

U.S. PATENT DOCUMENTS

| | | | |
|---|---|---|---|
| 6,223,314 B1 * | 4/2001 | Arabi et al. ................. | 714/726 |
| 6,453,437 B1 | 9/2002 | Kapur et al. | |
| 6,728,914 B2 * | 4/2004 | McCauley et al. .......... | 714/726 |
| 7,039,845 B2 * | 5/2006 | Rearick et al. .............. | 714/738 |
| 2005/0182587 A1 * | 8/2005 | Sato et al. ................... | 702/117 |
| 2007/0011543 A1 * | 1/2007 | Yoshimura et al. .......... | 714/738 |
| 2007/0288822 A1 * | 12/2007 | Lin et al. ..................... | 714/741 |

OTHER PUBLICATIONS

Manish Sharma, Janak H. Patel, "Testing of Critical Paths for Delay Faults," ITC International Test Conference 2001; Proceedings; Int'l Publication Date Oct. 30-Nov. 1, 2001; Paper 23.2, pp. 634-641.
Soumitra Bose, Prathima Agrawal, Vishwani D. Agrawal; "Deriving Logic Systems for Path Delay Test Generation," IEEE Transactions on Computers, vol. 47, No. 8, Aug. 1998, pp. 829-846.
C. Thomas Glover, M. Ray Mercer; "A Method of Delay Fault Test Generation," 25th ACM/IEEE Design Automation Conference; Paper 8.2, pp. 90-95.
Tapan J. Chakraborty, Vishwani D. Agrawal, Michael L. Bushnell; "Delay Fault Models and Test Generation for Random Logic Sequential Circuits,", 29th ACM/IEEE Design Automation Conference 1992; Paper 10.2, pp. 165-172.
Kameshwar Chandrasekar, Michael S. Hsiao; "Integration of Learning Techniques into Incremental Satisfiability for Efficient Path-Delay Fault Test Generation," Proceedings of the Design, Automation and Test in Europe Conference and Exhibition (Date 2005); vol. 2, pp. 1002-1007.

(Continued)

*Primary Examiner*—Phung M Chung
(74) *Attorney, Agent, or Firm*—Downs Rachlin Martin PLLC

(57) ABSTRACT

A method for automatically generating test patterns for digital logic circuitry using an automatic test pattern generation tool. The method includes generating test patterns and applying faulty behavior to various paths within the digital logic circuitry. As each circuit path is tested, tested circuit nodes along the circuit path are marked as "exercised." Subsequent test paths are assembled by avoiding marked circuit nodes. In this manner, coverage of paths tested may be increased and many circuit nodes can be tested efficiently.

8 Claims, 4 Drawing Sheets

OTHER PUBLICATIONS

Arun Krishnamachary, "Test Generation for Realistic Defects," Ph.D Thesis; Dec. 2003; http://dspace.lib.utexas.edu/bitstream/2152/47/1/krishnamacharya039.pdf.

W.B. Jone, Y.P. Ho, S.R. Das; "Delay Fault Coverage Enhancement Using Variable Observation Times," Journal of Electronic Testing, vol. 11, No. 2, Oct. 1997, pp. 131-146.

* cited by examiner

METHOD OF INCREASING PATH COVERAGE IN TRANSITION TEST GENERATION

FIELD OF THE INVENTION

The present invention generally relates to the field of test generation for integrated circuits (ICs). In particular, the present invention is directed to a method of increasing path coverage in transition test generation.

BACKGROUND

The testing of ICs has evolved into a highly developed area of technology. Generally such testing may be implemented through the use of external test equipment, Built-in Self-Test (BIST) circuitry, or a combination of the two. Typically, all test methodologies involve applying a test pattern to the primary inputs (pins or scannable memory elements) of an IC, capturing the test response at the primary outputs (pins or scannable memory elements) and then comparing the captured data with predetermined values to determine whether the circuit has performed according to design. Automatic test pattern generation (ATPG) tools are used for testing digital circuits after the circuits have been manufactured. In general, an ATPG tool generates a set of test patterns that are applied to a circuit under test. The output of the circuit is analyzed to identify logic faults in the circuit design (i.e., "functional testing"), as well as detecting fabrication defects (i.e., "structural testing").

ATPG tools are used to generate transition tests to detect delay defects in ICs. A transition fault in an IC refers to a circuit node (input, output, or internal node) that is slow to transition to the correct value. In general, some applications of transition fault test generation algorithms propagate transitions through the shortest circuit paths of the IC-under-test. The use of the shortest circuit paths simplifies the test generation by reducing the number and complexity of circuit paths tested. This method, however, reduces the likelihood of catching certain circuit defects, e.g., small delay defects, because the smaller delay defects may not manifest on the tested shorter circuit paths. To remedy this, in other applications, test generation algorithms focus on the longest paths for test generation. This method, unfortunately, becomes very complex and often takes far too long if only the longest paths are selected. In yet other applications, test algorithms rely on randomly chosen paths for test generation. This method, however, may not effectively catch some defects because the same path may be chosen every time. Accordingly, a new test generation algorithm is needed to exercise an increased number of original circuit paths during test generation in a more orderly manner.

SUMMARY OF THE DISCLOSURE

In one embodiment a method for testing a fault of an integrated circuit device, the integrated circuit device including one or more logic gates and a plurality of circuit nodes that include a plurality of primary inputs and a plurality of primary outputs, is provided. The method includes the steps of backtracing a faulty behavior being tested through the plurality of circuit nodes to at least one of the plurality of primary inputs; propagating then faulty behavior being tested through the plurality of circuit nodes to at least one of the plurality of primary outputs; marking the plurality of circuit nodes through which then faulty behavior is propagated; and repeating all the foregoing steps until a termination criterion is met.

In another embodiment, a method of automatically generating test patterns for testing a logic circuit, then logic circuit having one or more logic gates and a plurality of circuit nodes that include a plurality of primary inputs and a plurality of primary outputs, is provided. The method includes the steps of propagating a faulty behavior being tested from a selected logic gate to a primary input through one or more of the circuit nodes as a function of input path delay P; propagating then faulty behavior being tested from then selected logic gate to each of the plurality of primary outputs, so as to cause then faulty behavior being tested to propagate through each of the plurality of circuit nodes and each of the one or more logic gates positioned between then selected logic gate and the plurality of primary outputs; propagating then faulty behavior being tested from then selected logic gate to primary output through one or more of the circuit nodes as a function of input path delay P'; propagating then faulty behavior being tested from then selected logic gate to each of the plurality of primary inputs, so as to cause then faulty behavior being tested to propagate through each of the plurality of circuit nodes and each of the one or more logic gates positioned between then selected logic gate and the plurality of primary inputs; and repeating all the foregoing steps until a termination criterion is met.

In still another embodiment, a method of increasing the path coverage of automatic test pattern generation tools for testing the faults of an integrated circuit device, then device having a plurality of circuit nodes with a fault_previously_tested variable, is provided. The method includes the steps of determining a slack value for at least one of the plurality of circuit nodes; propagating a faulty behavior being tested from a selected circuit node to a primary input through one or more circuit nodes as a function of the fault_previously_tested variable; propagating then faulty behavior being tested from then selected circuit node to a primary output through one or more circuit nodes as a function of the fault_previously_tested variable; determining a size value for then faulty behavior tested; setting the fault_previously_tested variable equal to then size value; and repeating all the foregoing steps until a termination criterion is met.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
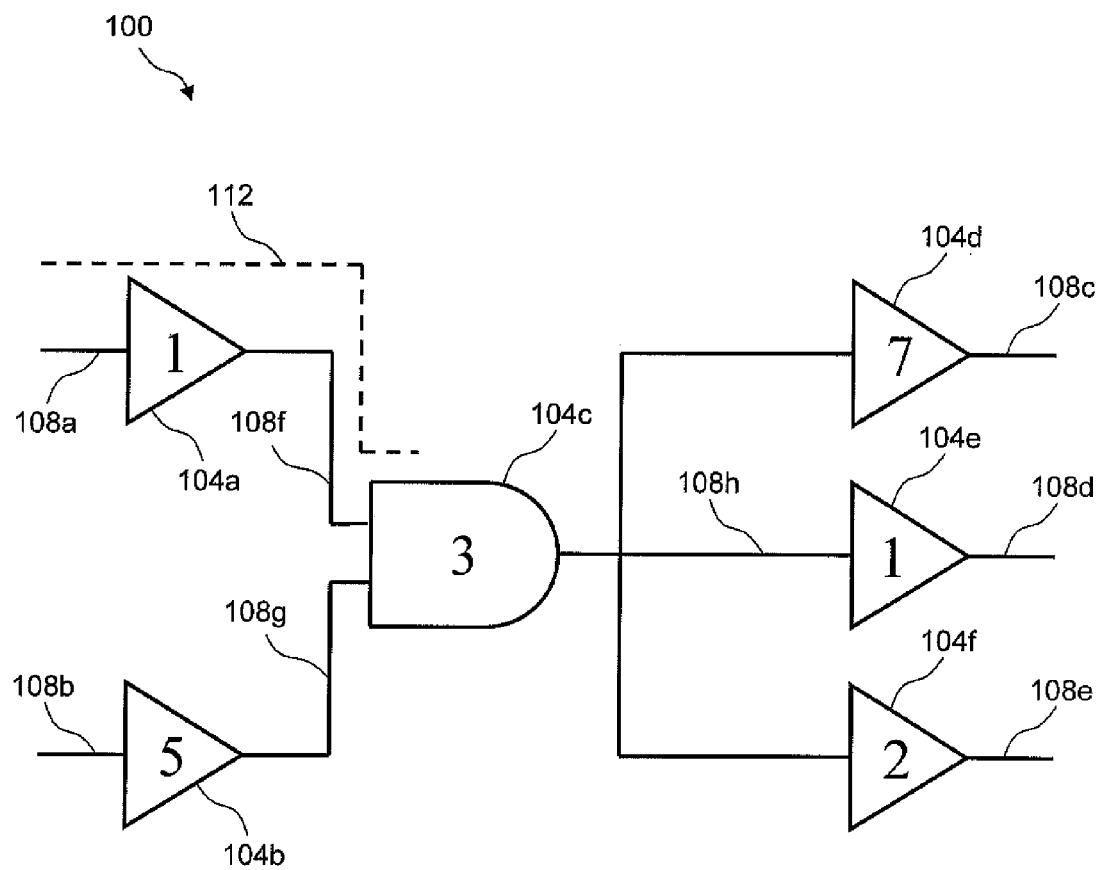
FIG. 1 is a schematic view of an integrated circuit that may be tested using a test method of the present disclosure.

Referring now to the drawings, FIG. 1 illustrates an example 100 of a test circuit that is the subject of the test method discussed in the present disclosure, as described in more detail below. Circuit 100 includes a plurality of logic gates 104a-f. A logic gate (e.g., gate 104a-f) is a basic electrical circuit component that performs a logic operation on one or more logic inputs. Examples of a logic gate include, without limitation, a BUFFER, an AND gate, an OR gate and a NAND gate. It will be appreciated that, in order to simplify the drawing, only Buffers are illustrated in FIG. 1. However, one of ordinary skill in the art will recognize that the test method of the present disclosure, and described in detail below, can work in connection with any type and any combination of logic gates.

Circuit 100 also includes a plurality of circuit nodes 108*a-j* that connect with logic gates 104*a-f*. A circuit node (e.g., circuit node 108*a-j*) is an electrical connection, typically a wire, that is used in the design and manufacture of integrated circuits, such as test circuit 100. In the present example, circuit nodes 108*a-j* include primary inputs 108*a-b*, primary outputs 108*c-e* and internal wires 108*f-j*. Those ordinarily skilled in the art will be readily familiar with the design and functionality of logic gates 104*a-f* and circuit nodes 108*a-j*, such that they need not be described in any detail herein, other than to the extent necessary to describe how unique features of the present disclosure can be implemented.

In some cases, logic gates 104*a-f* and circuit nodes 108*a-j* may collectively form a circuit path 112. A circuit path (e.g., circuit path 112) is a combination of logic gates and circuit nodes that form a contiguous logic circuit or a continuous portion of a logic circuit. In one example, a circuit path (e.g., circuit path 112) includes primary input 108*a*, logic gate 104*a* and internal wire 108*h*. In another example, a circuit path (e.g., circuit path 112) includes primary input 108*b*, logic gate 104*b* and internal wire 108*i*. Of course, it will be appreciated that a circuit path (e.g., circuit path 112) may include any combination of logic gates 104*a-f* and circuit nodes 108*a-j* that form a continuous combination of logic gates and circuit nodes.

Each of the plurality of logic gates 104*a-f* and circuit nodes 108*a-j* include a delay D. A delay (e.g., delay D) refers to the amount of time required for the faulty behavior being tested to pass through a gate (e.g., logic gates 104*a-f*) or a circuit node (e.g., circuit nodes 108*a-j*). In one example, the faulty behavior being tested includes a transition (not shown). A transition (not shown) is a type of faulty behavior associated with a delay fault model commonly recognized by those of ordinary skill and discussed in more detail below. In general, a delay D is measured in units of time, e.g., seconds. In this example, logic gates 104*a-f* have been assigned a delay D, as illustrated in FIG. 1 by the numerical value displayed within each of logic gates 104*a-f*. Accordingly, logic gate 104*a* has a delay D of 1 second, logic gate 104*b* has a delay D of 5 seconds, logic gate 104*c* has a delay D of 3 second, etc. Further, although not illustrated in FIG. 1, to simplify the description below, each of circuit nodes 108*a-j* has been assigned a delay D of 1 second.

Each of the plurality of logic gates 104*a-f* and circuit nodes 108*a-j* also include an input path delay P. An input path delay P refers to the longest delay measured from a primary input 108*a-b* to a selected logic gate 104*a-f* or circuit node 108*a-j*. An input path delay P is calculated by aggregating the delay D, discussed above, for each logic gate 104*a-f* and each circuit node 108*a-j* on each possible circuit path (e.g., circuit path 112) between a primary input 108*a-b* and a selected logic gate or internal wire, and determining the maximum value of the aggregate delays. The input path delay P for internal wire 108*i*, for instance, is determined by aggregating the values of the delay D for each of the possible circuit paths present from primary inputs 108*a-b* to internal wire 108*i*, and determining the maximum of the aggregate delays.

In test circuit 100 there are two possible circuit paths to internal wire 108*i*. One circuit path, for example, that includes primary input 108*a*, logic gate 104*a*, internal wire 108*f* and logic gate 104*c* has an aggregate delay of 6. Another circuit path, for example, that includes primary input 108*b*, logic gate 104*b*, internal wire 108*g* and logic gate 104*c* has an aggregate delay of 10. Accordingly, the input path delay P for internal wire 108*i* is the greater of the two aggregate values, or 10.

Further, each of the plurality of logic gates 104*a-f* and circuit nodes 108*a-j* also include an output path delay P'. An output path delay P' refers to the longest delay measured from a selected logic gate 104*a-f* or circuit node 108*a-j* to a primary output 108*c-e*. Like the input path delay P discussed above, an output path delay P' is calculated by aggregating the delay D for each logic gate 104*a-f* and each circuit node 108*a-j* on each possible circuit path (e.g., circuit path 112) between the selected logic gate or circuit node and a primary output 108*c-e*, and determining the maximum value of the aggregate delays. The output path delay P' for internal wire 108*i*, for instance, is determined by aggregating the values of the delay D for each of the possible circuit paths from internal wire 108*i* to primary outputs 110*c-e*, and determining the maximum of the aggregate delays.

In test circuit 100 there are three possible circuit paths from internal wire 108*i* to a primary output. In one example, a circuit path that includes logic gate 104*e* and primary output 108*d* has an output path delay P' of 2. In another example, a circuit path that includes internal wire 108*h*, logic gate 104*d* and primary output 108*c* has an output path delay P' of 9. In still another example, a circuit path that includes internal wire 108*j*, logic gate 104*f* and primary output 108*e* has an output path delay P' of 4. Accordingly, the output path delay P' for internal wire 108*i* in the present example is the greatest of the three aggregate values, or 9.

Figure 2:
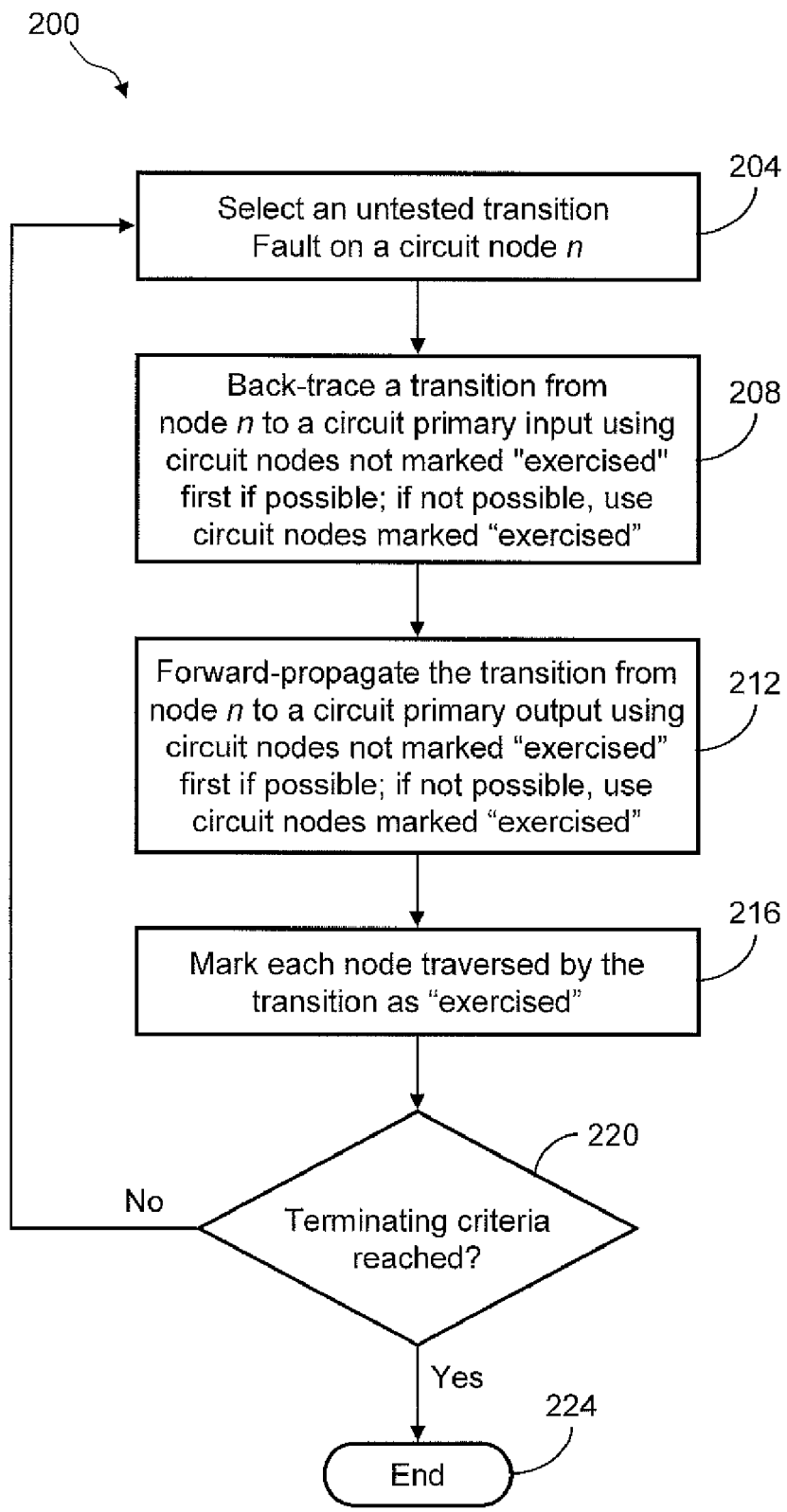
FIG. 2 is a flow diagram illustrating one embodiment of a test method of the present disclosure for testing the faulty behavior of the test circuit of FIG. 1.

Referring next to FIG. 2, and also FIG. 1, an example 200 of a test method that generates a test pattern for at least one circuit node 108*a-j* (FIG. 1) is illustrated. As discussed more below, test method 200 enables a circuit designer to evaluate the behavior of circuit nodes 108*a-j* (FIG. 1) by distinguishing between the correct behavior and the faulty behavior of the circuit nodes of test circuit 100 (FIG. 1).

A fault model is a collection of faults used by a circuit designer to test faulty behavior. These tests, often, predict the consequences of particular faults as they relate to the present circuit design. There are various examples of fault models recognized in the art. In one example, the fault model may be a stuck-at-fault model where a signal is stuck at a 0 or 1 value independent of the inputs to the circuit. In another example, the fault model may be a bridging fault model where two signals are connected together where the signals should not be connected. In yet another example, the fault model may be an open fault model where one or more outputs are disconnected from the input that should drive the output. In still another example, the fault model may be a delay fault model where the signal eventually assumes the correct value more slowly than expected by the design. As discussed more below, a delay fault model will be used to simplify the description as it relates to the generation of a test pattern through the application of test method 200 to a test circuit (e.g., test circuit 100 (FIG. 1)). It may be appreciated, however, that test method 200 may generate test patterns for any of the aforementioned fault models.

In this example, at step 204, test method 200 selects an untested faulty behavior for a specific circuit node n (e.g., circuit nodes 180*a-j* (FIG. 1)). Once a faulty behavior is selected, test method 200 back-traces a faulty behavior at step 208, by propagating the faulty behavior being tested from circuit node n, described above, to a primary input (e.g., primary inputs 108a-b (FIG. 1)) along a circuit path (e.g., circuit path 112), as described more below. In general, traditional fault test generation algorithms propagate the faulty behavior along the shortest circuit path, i.e., the circuit path having the shortest input path delay P as determined in accordance with the discussion above. The selection of the shortest circuit path, however, reduces the likelihood of recognizing faulty behavior that will not manifest along these short circuit paths.

On the other hand, a test method in accordance with the present disclosure may select from a variety of circuit paths. In one example test method 200 may propagate the faulty behavior being tested along the shortest circuit path. In another example, test method 200 may propagate the faulty behavior being tested along the longest circuit path, i.e. the circuit path having the longest input path delay P. In still another example, test method 200 may chose a circuit path at random from among the possible circuit paths in the test circuit.

After the faulty behavior being tested is back-traced, test method 200, at step 212, forward-traces the particular fault by propagating the faulty behavior being tested from the same circuit node n selected in step 208 to a primary output (e.g., primary outputs 108c-e (FIG. 1)) along a circuit path (e.g., circuit path 112). As described in relation to back-tracing the faulty behavior being tested in step 208, the selection of the circuit path for use in test method 200 may be based on the length of the circuit as determined by calculating the output path delay P', discussed above. Accordingly, test method 200 may propagate the faulty behavior being tested along the shortest circuit path, the longest circuit path, or alternatively, along a circuit path chosen at random from among the possible circuit paths in the test circuit.

Once the faulty behavior being tested is propagated, test method 200, at step 216, marks the circuit nodes (e.g., circuit nodes 108a-j (FIG. 1)) through which the faulty behavior being tested has just been propagated as "exercised." An "exercised" circuit node refers to a circuit node through which faulty behavior being tested has been propagated. In one example, this mark may be a binary digit, e.g., 0 or 1, with either of these digits representing an "exercised" or "unexercised" circuit node (e.g., circuit nodes 108a-j (FIG. 1)), as desired. Of course, those skilled in the art will recognize the various ways that a circuit node might be distinguished, such that no additional explanation will be provided herein.

After all exercised circuit nodes are marked, test method 200 determines, at step 220, whether the test sequence should be completed, e.g., at step 224, based on a termination criterion, as illustrated in FIG. 2. A termination criteria may terminate test method 200 when some maximum number of tests have been generated. In another example, test method 200 may terminate when at least one test has been generated for every faulty behavior being tested. In yet another example, test method 200 may terminate when every circuit node in the circuit has been marked "exercised". In still another example, test method 200 may terminate when some maximum number of faulty behaviors have been tested.

If, e.g., the termination criterion has not been met, test method 200 will repeat steps 204-220. On each iterative step, however, test method 200 will select circuit nodes (e.g., circuit nodes 108a-j (FIG. 1)) that are not marked as "exercised." This selective process increases the number of circuit paths that will be tested by test method 200 without requiring the use of other test generation techniques, e.g., path delay test generation, that are recognized in the art. In addition, this process avoids repeated testing of the same faulty behavior on the same circuit paths by systematically marking tested circuit nodes as "exercised."

Figure 3:
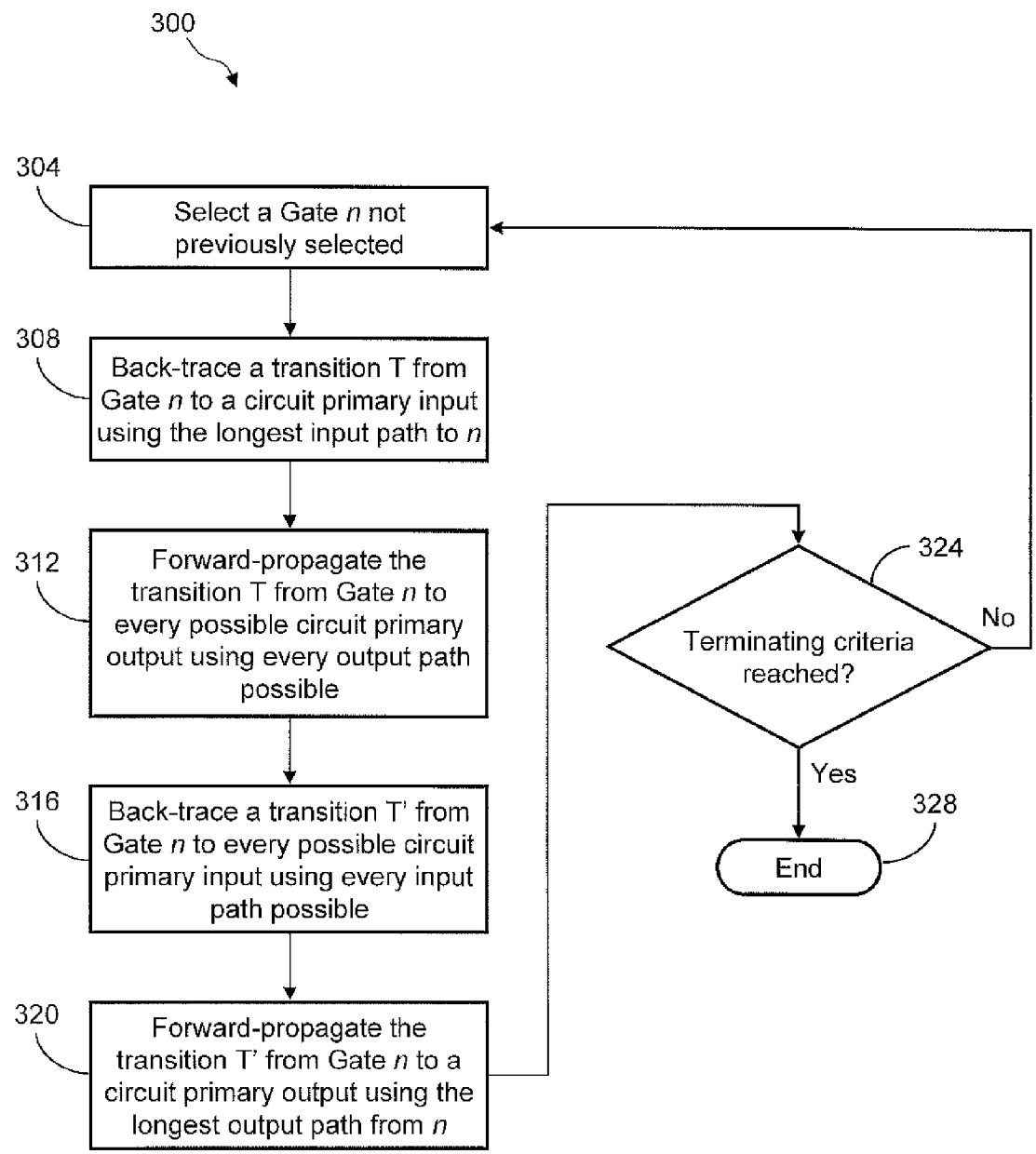
FIG. 3 is a flow diagram of another embodiment of a test method for testing the faulty behavior of the test circuit of FIG. 1.

Referring next to FIG. 3, and also FIG. 1, another example 300 of a test method is illustrated. In this example, test method 300, at step 304, applies a fault model to a specific logic gate ii (e.g., logic gate 104a-f (FIG. 1)). The fault model, as discussed above, may vary according to a specific design criteria and/or a specific testing requirement, as desired. For clarity, the fault model described in test method 300, like the fault model discussed in relation to test method 200 (FIG. 2), is a delay fault model.

Once a fault model is selected, test method 300 back-traces a faulty behavior, at step 308, by propagating the faulty behavior being tested from a logic gate n, described above, to a primary input (e.g., primary inputs 108a-b (FIG. 1)) along a single circuit path (e.g., circuit path 112). In this example, test method 300 selects the longest circuit path based on the calculation of the input path delay P, discussed above. If, for example, test method 300 tests logic gate 104c (FIG. 1), the faulty behavior being tested would be propagated along the longest circuit path from logic gate 104c (FIG. 1) to a primary input 108a-b (FIG. 1). This circuit path, which includes internal wire 108g (FIG. 1), logic gate 104b (FIG. 1) and primary input 108b, has an input path delay P of 7.

After the faulty behavior being tested is back-traced, test method 300 forward-traces the faulty behavior, at step 312, by propagating the faulty behavior being tested through all possible circuit paths originating from the selected logic gate n to every primary output (e.g., primary output 108c-e (FIG. 1)). Thus, in the example above, a test of logic gate 104c (FIG. 1) would include propagating the faulty behavior being tested along three circuit paths; a circuit path including internal wire 108i (FIG. 1), logic gate 104e (FIG. 1) and primary output 108d (FIG. 1); a circuit path including internal wire 108i (FIG. 1), internal wire 108h (FIG. 1), logic gate 104d (FIG. 1) and primary output 108c (FIG. 1); and a circuit path including internal wire 108i (FIG. 1), internal wire 108j (FIG. 1), logic gate 104f (FIG. 1) and primary output 108e (FIG. 1).

As illustrated in FIG. 3, test method 300 continues by back-tracing the faulty behavior, at step 316, through all possible circuit paths (e.g., circuit path 112 (FIG. 1)) originating from the selected logic gate n to every primary input (e.g., primary input 108a-b (FIG. 1)). If, e.g., logic gate 104c (FIG. 1) is selected, then test method 300 would propagate the faulty behavior being tested along two circuit paths; a circuit path including internal wire 108f (FIG. 1), logic gate 104a (FIG. 1) and primary input 108a (FIG. 1); and a circuit path including internal wire 108g (FIG. 1), logic gate 104b (FIG. 1) and primary input 108b (FIG. 1). Next, test method 300 forward-traces the faulty behavior, at step 320, by propagating the faulty behavior being tested along a single circuit path (e.g., circuit path 112 (FIG. 1)) having the longest output path delay P', as determined by the calculation above. In the present example, the circuit path originating with logic gate 104c (FIG. 1) having the longest primary output P' would be internal wire 108i (FIG. 1), internal wire 108h (FIG. 1), logic gate 104d (FIG. 1) and primary output 108e (FIG. 1), with a delay P' of 10.

In this example, test method 300 continues, at step 324, to test the faulty behavior of the test circuit (e.g., test circuit 100) until a terminating criteria is met. As discussed above, a termination criteria may terminate test method 200 when some maximum number of tests have been generated, when at least one test has been generated for every faulty behavior being tested, or when some maximum number of faulty behaviors have been tested, among others. Test method 300, at step 324, will repeat steps 304-320, until, e.g., the termination criteria is met, or some other terminating event is reached.

Figure 4:
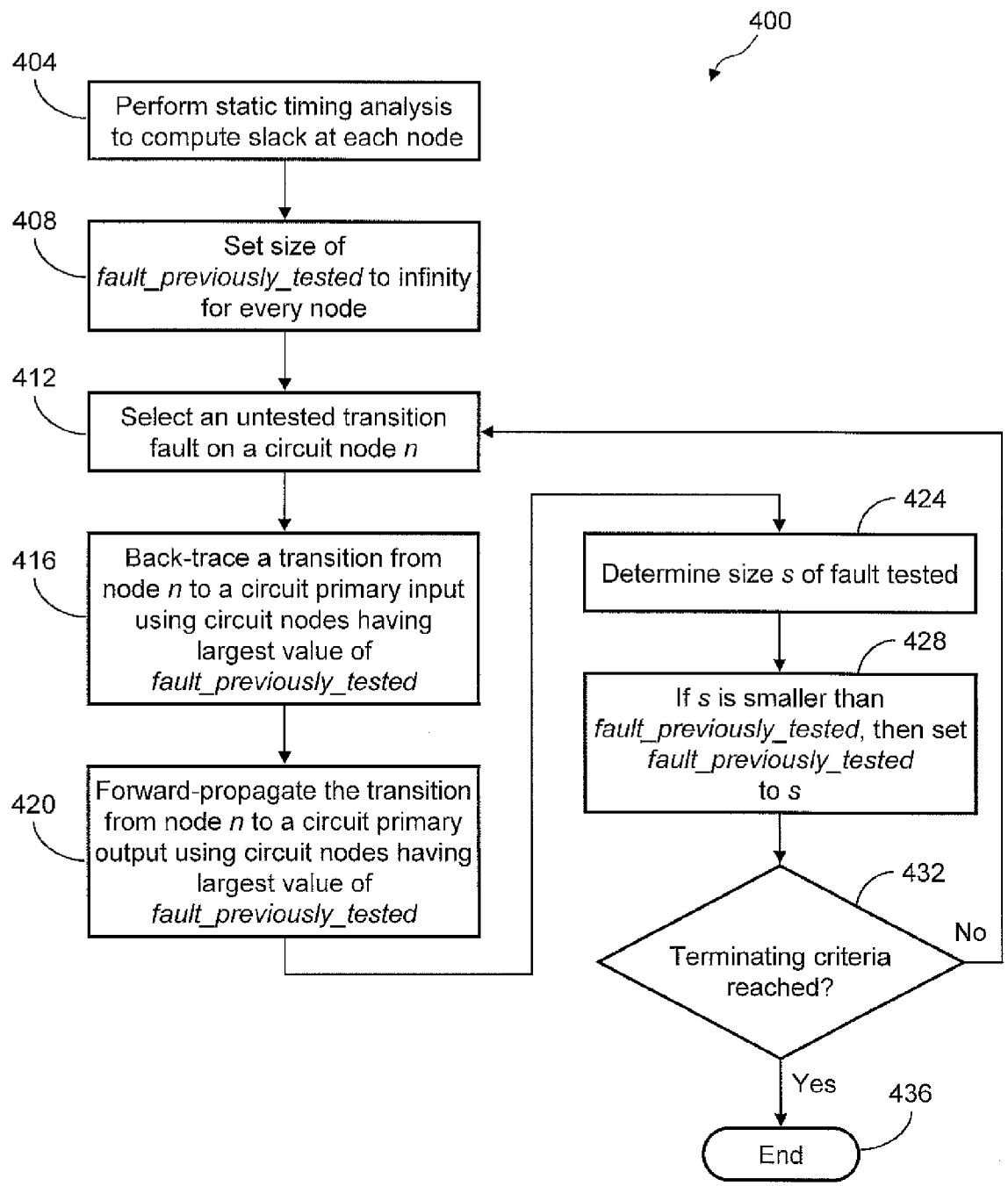
FIG. 4 is a flow diagram of another embodiment of a test method for testing the faulty behavior of the test circuit of FIG. 1.

Referring next to FIG. 4, and also FIG. 1, an example 400 of a test method is illustrated. For purposes of the discussion below, test method 400 utilizes a delay fault model, as discussed in relation to test method 200 (FIG. 2) and test method 300 (FIG. 3) above. It may be appreciated, however, that any fault model, such as the fault models referenced above, may be implemented. In this example, test method 400 prefers circuit nodes (e.g., circuit nodes 108a-j (FIG. 1)) on which the smallest possible faulty behavior has not been previously tested. This preference is based, in part, on the determination of what faulty behavior has been previously propagated on circuit paths (e.g., circuit paths 112 (FIG. 1)) having a very large slack value. A slack value is a calculated value associated with functional errors that may occur when a fault model is applied to a circuit path. In one example, a slack value for a transition fault is the minimum value for the faulty behavior being tested that causes a functional error in the circuit path. In general, test method 400 may utilize a variety of methods to calculate the slack values for a test circuit (e.g., test circuit 100 (FIG. 1)). These methods are commonly known and referred to by those of ordinary skill, such that no additional explanation will be provided herein, other than to the extent necessary to describe how test method 400 of the present disclosure may be implemented.

In the present example, test method 400, at step 404, uses a static timing analysis to calculate the slack value for each circuit node (e.g., circuit nodes 108a-j (FIG. 1)). Once the slack values are determined, test method 400, at step 408, assigns a variable associated with each circuit path, e.g., fault_previously_tested, to ∞. Once the fault_previously_tested variable is set, test method 400 initiates the back-trace and forward-trace propagation steps by first selecting, at step 412, an untested faulty behavior for a selected circuit node n (e.g., circuit nodes 108a-j (FIG. 1)). As mentioned above, a delay fault model is used in test method 400 for clarity.

Once a fault model is selected, test method 400 proceeds, at steps 416 and 420, to propagate the faulty behavior being tested through the test circuit (e.g., test circuit 100) in a manner similar to test method 200, in which the selected faulty behavior being tested is propagated along a circuit path from the selected circuit node to a primary input (e.g., primary inputs 108a-b (FIG. 1)) and to a primary output (e.g., primary outputs 108c-e (FIG. 1)). In the present example, test method 400 selects a circuit path in steps 416 and 420 that includes circuit nodes and logic gates that have the greatest value assigned to fault_previously_tested variable.

As test method 400 proceeds, the value of the fault_previously_tested variable may be modified. In general, the faulty behavior being tested is described as a function that varies in relation to edges in a timing or delay graph. These graphs illustrate an increase in the delay of an edge in the timing graph over the expected maximum delay of the edge due to a defect. Those of ordinary skill will appreciate that the objective of this function is to calculate the smallest faulty behavior being tested or the smallest increase in the delay that is tested at various delay edges by a particular test pattern. However, even though these calculations may statistically determine that a faulty behavior will be tested, the actual timing of the test circuit might limit the detectable faulty behavior to only those faulty behaviors having large delays.

In this example, test method 400 avoids this limitation when it determines the smallest faulty behavior that is tested at the various delay edges by a particular test pattern. This determination requires specific inputs, including (i) a combinational logic circuit that includes logic gates that consist, e.g., of only AND, OR, BUFFER, NAND, NOR and NOT logic gates, (ii) an associated acyclic delay graph (not shown) that includes nodes that represent pins of the logic gates in the logic circuit, and edges that represent input to output paths of a logic gate and source to sink connections of a circuit node, (iii) a transition test T, e.g., a pair of vectors applied to primary inputs of the logic circuit, and (iv) a period P, e.g., the interval between the launch of the second transition test T and the capture of the result. It may be appreciated that those of ordinary skill will recognize the nature and application of these specific inputs described above, such that no additional information will be presented herein, other than to the extent necessary to describe how these inputs are applied in relation to the present disclosure, as discussed more below.

Specifically, test method 400, at step 424, determines the size of the faulty behavior being tested for the specific circuit node n. In this example, test method 400 performs a pattern-specific timing analysis of the logic circuit to determine the slack values at each circuit node specifically for transition test T, discussed above. In one example, a simulation of transition test T may be performed on the logic circuit to determine the values or transitions that occur on all circuit nodes in the logic circuit. To perform this simulation, a Required Arrival Time (RAT) variable of P is assigned for each primary output to which a faulty behavior propagates. Further, an Arrival Time (AT) variable is assigned a value of 0 at every primary input that transitions in T. In addition, RAT is set to +∞ at every primary output to which no faulty behavior propagates and AT is set to −∞ at every circuit primary input which does not transition in T.

The ATs may be propagated forward through the circuit as follows: (i) for every gate input i driven by net source j, $AT_i = AT_j + delay_{ji}$, (ii) for every gate output that is transitioning to its "controlled" state (0 for AND and NOR, 1 for NAND and OR), $AT_{out}$ is the minimum over all inputs i that are transitioning to the controlling state (0 for AND and NAND, 1 for OR and NOR) of $AT_i + delay_{i\ out}$. Transitions to both 0 and 1 are "controlled" for a NOT or BUFFER, (iii) for every gate output that is transitioning to its "non-controlled" state (1 for AND and NOR, 0 for AND and OR), $AT_{out}$ is the maximum over all inputs i that are transitioning to the non-controlling state (1 for AND and NAND, 0 for OR and NOR) of $AT_i + delay_{i\ out}$.

The RATs may be propagated backward through the circuit as follows: (i) for every net source i (gate output) feeding net sinks j, $RAT_i = $ min over j of $RAT_j - delay_{ij}$, (ii) for every gate input i that is transitioning to its controlling state, whose other gate inputs are all stable in their non-controlling states, and whose gate output is transitioning to its controlled state, $RAT_i = RAT_{out} - delay_{i\ out}$, (iii) for every gate input i that is transitioning to its controlling state, and for which gate inputs are transitioning, $RAT_i = +\infty$, (iv) for every gate input i that is transitioning to its non-controlling state and whose gate output is transitioning to its non-controlled state, $RAT_i = RAT_{out} - delay_{i\ out}$, (v) for every input i of each gate whose output is not transitioning, $RAT_i = -\infty$. Accordingly, the slack on each node i is then simply $RAT_i - AT_i$. If the slack is greater than or equal to 0, this is also the size of delay fault at the node that is tested by transition test T. If the slack is less than 0 the fault is not tested by transition test T.

Variations to the calculations discussed above may be made to improve efficiency. In one example, the AT and RAT propagation do not actually need to visit and assign values to non-transitioning nodes. In another example, the AT calculation may be combined with the forward propagation of values and propagate along the forward path which has the largest value of fault_previously_tested and has a RAT from normal static timing analysis which, when combined with the transition test-specific AT of the point would produce a slack value $\geq 0$ (for transition test sampling period P). In still another example, the determination may be done without a predetermined value of P. An initial value of P, e.g., the functional clock period of the part, may be chosen for the analysis. The applied value of P for the test may then be adjusted such that the slack value for the targeted test is non-negative. A separate value of P may be chosen to make this slack value exactly zero, in which case the test will give the greatest possible sensitivity to faulty behavior being tested at the targeted transition. In yet another example, P may be chosen from a set of pre-determined test application periods, as the smallest value that causes the slack of the targeted transition to be non-negative.

Referring back to FIG. 4, after the determination of the length of the faulty behavior being tested, test method 400, at step 428, determines if the calculated length is smaller than the value of the fault_previously_tested variable. If e.g., the length of the transition is smaller, then the value of the fault_previously-tested variable is set to the calculated length. Next, once all fault_previously_tested variables have been set, test method 400 determines, at step 432, whether the test sequence should be completed based on a termination criterion, as illustrated in FIG. 4. The termination criteria, described above, may terminate test method 400 when some maximum number of tests have been generated. In another example, test method 400 may terminate when at least one test has been generated for every faulty behavior being tested. In yet another example, test method 400 may terminate when every faulty behavior being tested has a fault_previously_tested less that some specified threshold. In still another example, test method 400 may terminate when every faulty behavior being tested has a fault_previously_tested that exceeds its slack value as computed in step 404.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of fault-testing a logic circuit of an integrated circuit, wherein the logic circuit includes: 1) a plurality of logic gates, 2) a plurality of circuit nodes connecting together ones of the plurality of logic gates, 3) a plurality of primary inputs, and 4) a plurality of primary outputs, the method comprising:
   Setting a termination criterion for terminating fault testing,
   Selecting a node from among the plurality of nodes;
   back-tracing a faulty behavior being tested from the node to a selected one of the primary inputs along a first path that traverses through the plurality of circuit nodes to the selected one of the plurality of primary inputs;
   forward-propagating the faulty behavior being tested from the node to a selected one of the primary outputs along a second path that traverses through the plurality of circuit nodes to the selected one of the plurality of primary outputs;
   marking as exercised ones of the plurality of circuit nodes through which the faulty behavior is propagated along the first and second paths; and
   repeating each of said selecting, said back-tracing, said forward-propagating and said marking steps until the termination criterion is met.

2. The method of claim 1, further comprising selecting an untested faulty behavior.

3. The method of claim 1, further comprising selecting the plurality of circuit nodes as a function of an input path delay.

4. The method of claim 1, further comprising selecting the plurality of circuit nodes as a function of an output path delay.

5. The method of claim 1, wherein said repeating occurs along circuit nodes not marked as exercised.

6. The method of claim 1, wherein said repeating includes referring paths that contain ones of the plurality of nodes that have not yet been marked as exercised.

7. The method of claim 1, further comprising setting the termination criterion to one or more of a maximum number of generated tests, a number of generated tests having at least one test generated for every faulty behavior, a number of generated tests having every circuit node in the integrated circuit marked as exercised, and a number of generated tests having a maximum number of faulty behaviors tested.

8. The method of claim 1, wherein setting the termination criterion includes setting the termination criterion so as to cause all of the plurality of logic gates in the logic circuit to be tested.

* * * * *